United States Patent
Cowley et al.

(10) Patent No.: US 7,437,134 B2
(45) Date of Patent: Oct. 14, 2008

(54) TUNER ARRANGEMENT

(75) Inventors: Nicholas Paul Cowley, Wiltshire (GB); Terry Aliwell, Lincolnshire (GB)

(73) Assignee: Intel Corporation, Santa Clara, CA (US)

( * ) Notice: Subject to any disclaimer, the term of this patent is extended or adjusted under 35 U.S.C. 154(b) by 613 days.

(21) Appl. No.: 11/128,335

(22) Filed: May 13, 2005

(65) Prior Publication Data
US 2005/0260961 A1 Nov. 24, 2005

(30) Foreign Application Priority Data
May 22, 2004 (GB) ................................ 0411483.1

(51) Int. Cl.
*H04B 1/18* (2006.01)
(52) U.S. Cl. .................. 455/191.1; 455/150.1; 455/255; 455/317; 455/323
(58) Field of Classification Search ................ 455/63.1, 455/67.11, 67.13, 130, 131, 179.1, 183.1, 455/184.1, 187.1, 188.1, 191.1, 295, 296, 455/230, 255, 313, 317, 323, 3.02, 3.04
See application file for complete search history.

(56) References Cited

U.S. PATENT DOCUMENTS

| | | | |
|---|---|---|---|
| 4,340,975 A * | 7/1982 | Onishi et al. ............. | 455/188.2 |
| 4,553,264 A * | 11/1985 | Hasegawa et al. ......... | 455/189.1 |
| 4,661,995 A | 4/1987 | Kashiwagi | |
| 5,115,317 A * | 5/1992 | Igarashi et al. ........... | 455/190.1 |
| 5,343,168 A * | 8/1994 | Guthrie ....................... | 331/16 |
| 5,847,612 A * | 12/1998 | Birleson ..................... | 455/316 |
| 6,057,876 A * | 5/2000 | Waight .................... | 455/197.1 |
| 6,567,654 B1 | 5/2003 | Coronel Arredondo et al. | |
| 2004/0117861 A1 | 6/2004 | Dessert et al. | |

FOREIGN PATENT DOCUMENTS

| | | |
|---|---|---|
| DE | 101 16 880 A1 | 10/2002 |
| EP | 1 182 774 A3 | 1/2004 |
| EP | 1 248 360 A3 | 4/2004 |

* cited by examiner

*Primary Examiner*—Quochien B Vuong
(74) *Attorney, Agent, or Firm*—Blakely, Sokoloff, Taylor & Zafman LLP

(57) ABSTRACT

A tuner arrangement is provided comprising one or more tuners. Each tuner has two or more frequency changers, each comprising a mixer and a local oscillator. A controller controls the local oscillators in response to receipt of a channel select request. The controller determines the nominal frequencies of the local oscillators for tuning the selected channel and then performs a calculation to determine whether any beat frequencies between harmonics greater than the first harmonic of the local oscillators lie within the frequency band at the tuner output occupied by the selected channel. If so, the controller shifts the local oscillator frequencies so as to move the potentially interfering products outside the utilised band and then tunes the local oscillators appropriately.

10 Claims, 2 Drawing Sheets

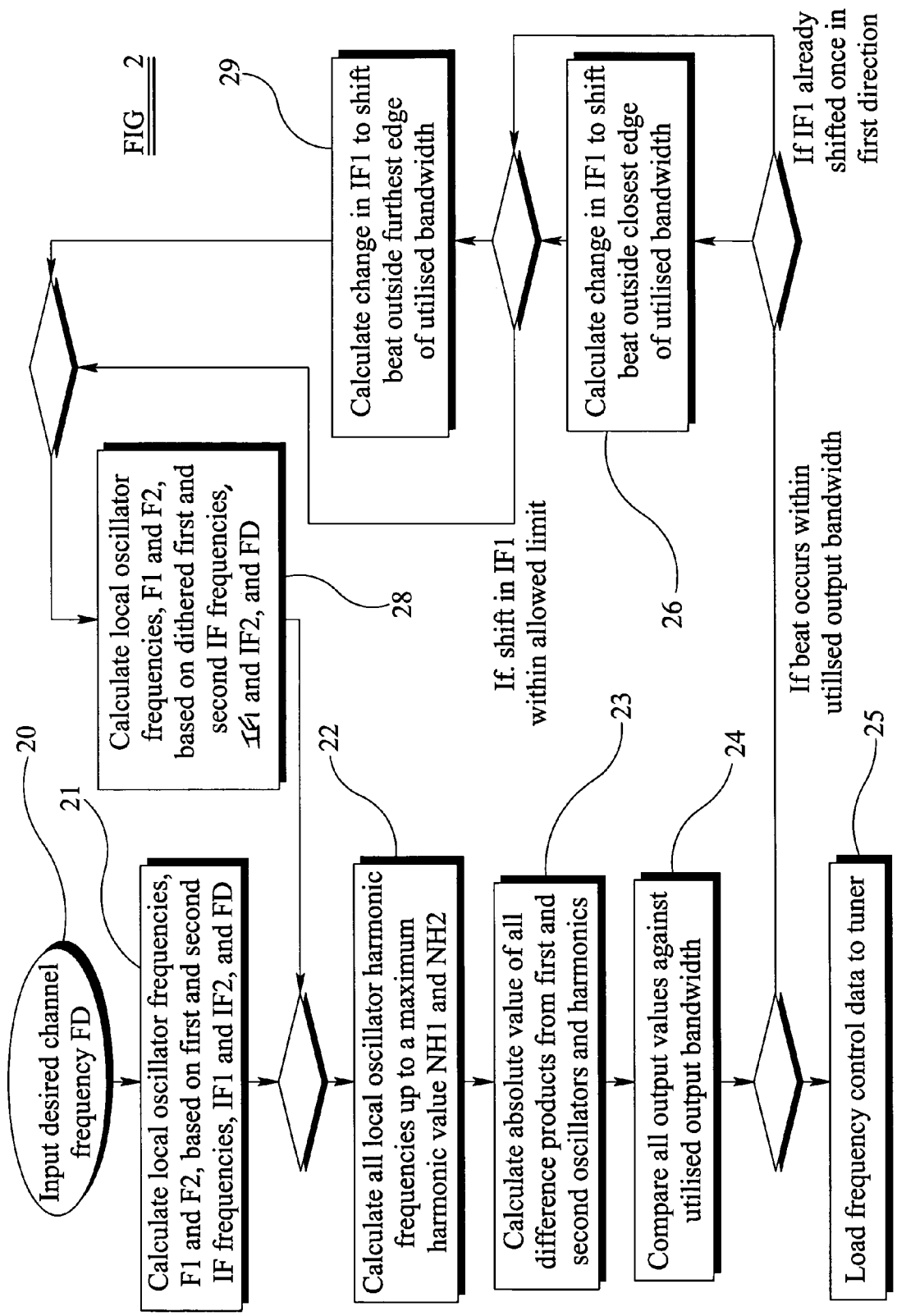

TUNER ARRANGEMENT

TECHNICAL FIELD

The present invention relates to a tuner arrangement. For example, such a tuner arrangement may be used to select signals for reception, such as television, audio or data signals distributed by a cable system or broadcast by a terrestrial or satellite system.

BACKGROUND

It is known that tuners having two or more frequency converters may suffer from the generation of spurious heterodyning products appearing in the frequency band of the output signal and resulting from spurious non-linear mixing of two or more of the local oscillator signals. For example, a known type of double-conversion tuner comprises a first upconverter for converting the frequency of any selected channel to a high first intermediate frequency, such as 1220 MHz, by high-side mixing, i.e., the local oscillator in the first frequency converter is at a frequency above that of the selected channel. The channel at the high intermediate frequency is then down-converted in a second frequency changer to a second output intermediate frequency, such as 45.75 MHz, by low-side mixing, i.e., the local oscillator in the second frequency converter is at a frequency below the first intermediate frequency. Such a tuner may be used to select, from a broadband input signal containing a plurality of channels available for reception, a channel for example at a frequency of 751.25 MHz. The first local oscillator is thus set to a frequency of 1971.25 MHz to convert the selected channel to the first intermediate frequency of 1220 MHz. The second local oscillator is set to a frequency of 1174.25 MHz to convert the selected channel from the first intermediate frequency to the second or output intermediate frequency of 45.75 MHz.

The first and second local oscillators also produce outputs at harmonics, higher than the first harmonic or fundamental frequency, and such harmonics may mix non-linearly to produce spurious products within the actually utilised bandwidth at the second intermediate frequency, for example from 41 to 47 MHz. For example, the third harmonic of the first local oscillator will be at a frequency of 5913.75 MHz and the fifth harmonic of the second local oscillator will be at a frequency of 5871.25 MHz. Spurious heterodyning may result in a spurious product at a frequency of 42.5 MHz being present in the output signal, which is within the frequency spectrum actually occupied by the selected channel at the second intermediate frequency.

Another example of generation of a spurious heterodyne product within the output frequency band occurs when the above-described tuner selects an input channel at 157.25 MHz. In this case, the first local oscillator is tuned to a frequency of 1377.25 MHz and the second local oscillator is tuned to a frequency of 1174.25 MHz (as before). The sixth harmonic of the first local oscillator and the seventh harmonic of the second local oscillator are then at 8263.5 MHz and 8219.25 MHz, respectively, so that a spurious product can be produced at 43.75 MHz, which is within the utilised output bandwidth.

The actual frequencies at which such beats or products occur are dependent, among other factors, upon the first and second intermediate frequencies. Problems caused by such beats may therefore be overcome, as is known, by varying the first high intermediate frequency. For example, in the situation where a channel at 751.25 MHz is selected for reception, the first intermediate frequency may be changed to 1221 MHz; this is generally permissible because the bandwidth of any intermediate frequency filtering at the first high intermediate frequency is generally sufficiently wide to pass several channels so that a shift of the order of 1 MHz in the first intermediate frequency will not result in unacceptable performance of the tuner. In order to provide the shifted first intermediate frequency, the first local oscillator frequency is changed to 1972.25 MHz and the second local oscillator frequency is changed to 1175.25 MHz. The third harmonic of the first local oscillator is now at 5916.75 MHz whereas the fifth harmonic of the second local oscillator is now at 5876.25 MHz. The resulting heterodyne product is now at a frequency of 40.5 MHz and is thus outside the output bandwidth at the second intermediate frequency utilised by the selected channel.

A known "empirical" method for determining shifts in intermediate frequency to avoid problems with spurious heterodyne products is performed during a development phase of a tuner. During this phase, the desired channels are supplied to the tuner and the output spectrum is observed on test equipment, such as a spectrum analyser. If spurious output beats are observed, the first intermediate frequency is manually varied so as to remove the beat from the frequency band utilised at the output of the tuner. The variation is then recorded and written into control software for the tuner.

This process has to be performed for each channel available for reception by the tuner and thus is relatively time-consuming and prone to human error. Also, the resulting intermediate frequency variations or "dither pattern" will only apply to a given set of conditions, i.e., choice of the nominal first and second intermediate frequencies, the channel bandwidth utilised within the tuner and the frequency planning of the received spectrum.

Another disadvantage of this technique is that, if the received channels can vary in their frequency, then the empirically determined dither pattern may no longer apply. In practice, this may arise, for example, when a tuner of this type is used with a preconversion stage, as in the case of satellite receiver systems where the received channels are first down-converted by an external block converter to the tuner input frequency range. In this example, the external conversion has an absolute frequency accuracy or tolerance of ±5 MHz and the frequency of each channel may vary within these limits from the nominal channel frequency.

Another known "measurement" technique is used when a tuner is actually installed in a receiving system or apparatus. In this technique, the system is required to include arrangements for measuring spurious heterodyne products or beats together with, for example, control software for adjusting the first intermediate frequency in order to eliminate any beats which are measured. The control software may, for example, be provided within the digital signal processing of a digital demodulator.

Effectively, the same empirical method as described hereinbefore is performed during operation of a system including the tuner, for example whenever a change is requested to the channel selected for reception. However, this technique requires the presence of monitoring means for monitoring the presence of spurious products together with sophisticated software requiring processing time and memory allocation within a system controller. Also, the time required for performing this technique may be objectionably large to a user.

It is also known to provide tuner arrangements comprising two or more tuners, each of which is of the multiple conversion, such as double conversion, type. In the case of a dual tuner arrangement, there are four or more local oscillators which are independently adjustable. Such arrangements are required to be compact and all of the tuners present in the arrangement generally receive the same broadband input signal. There is therefore a high risk that all four or more oscillators will beat with each other to cause spurious beat products within the utilised output bandwidth of either or both tuners.

The above-described empirical technique may be used with such multiple-tuner arrangements. However, when empirically determining each dither pattern, the frequencies of the local oscillators of the other tuner or tuners must be taken into account as they can beat with the local oscillators of the tuner whose dither pattern is being determined.

The possible interaction between the tuners results in a substantial increase in the time required to perform the empirical technique. For example, in the case of a dual tuner arrangement where each tuner is capable of receiving any one of one hundred input channels, beat product measurement and intermediate frequency variation must be assessed for each combination of channels for each tuner. This results in there being twenty thousand combinations, all of which must be assessed by the empirical technique. This technique is therefore extremely time-consuming.

Furthermore, this technique can never be completely reliable. For example, even if a dual-tuner arrangement has been properly set up by the empirical method, problems can occur during use as follows.

When each of the tuners is tuned to select respective input channels for reception, there will be no spurious heterodyne products or beats in the utilised output bandwidths of the tuners. However, if a first of the tuners is then re-tuned to a different channel which requires "dithering" or variation of the first intermediate frequency in the second tuner, the second tuner cannot be re-tuned since this would cause a break in reception. The spurious product can therefore only be removed satisfactorily by varying the first intermediate frequency of the first tuner. The first tuner will then no longer be set to the first intermediate frequency appropriate for the channel being received so that the "beat dithering pattern" established empirically is no longer valid. When the second tuner is re-tuned to select a different channel, the inappropriate first intermediate frequency of the first tuner remains so that there is no longer any information, for the new operating mode of the two tuners, as to whether a beat exists so that no action can be taken if a spurious beat is present in the utilised output bandwidth of either tuner.

The measurement technique may also be applied to a multiple-tuner arrangement but is not wholly satisfactory. In order to describe this, the example of a dual-tuner arrangement will again be considered.

Assuming that both tuners are initially correctly aligned and that any spurious beats have been eliminated, if a first of the tuners is re-tuned to select a different channel and spurious beats exist in the utilised output bandwidth, such spurious beats may be detected and removed by varying the first intermediate frequency of the first tuner in response to the monitored outputs of both the first and second tuners. Although this process will remove spurious beats, such beats will be present in the channel selected by the second tuner for a period during which disruption in reception by the second tuner may occur.

EP1248360 discloses a double conversion tuner which uses a table containing offsets for first and second oscillator frequencies. This technique IS specifically concerned with spurs forming within the passband of the first intermediate frequency (IF) filter but only discloses varying the second oscillator frequency so that the second IF will also vary when an offset is required to avoid a spur. The table is formed during design of the receiver.

U.S. Pat. No. 6,567,654 provides a table for a set of different first intermediate frequencies, which table is calculated using a computer or the like. The table is then used to determine a further table of frequency synthesiser controlling words for first and second local oscillators to avoid spurs.

EP1187774 discloses two techniques for avoiding interference. In the first, a look-up table is formed during development. In the second, the local oscillator frequencies are offset dynamically while monitoring tuner performance so that offsetting is adjusted until acceptable performance is achieved.

U.S. Pat. No. 4,661,995 makes use of pre-calculated values to avoid spurs and to shift first and second local oscillator frequencies in order to provide a constant second IF.

DE10116880 discloses a technique for compensating for temperature shift in the centre frequency of a first IF filter. This is performed by measuring temperature and using this to determine frequency shifts for first and second local oscillators.

SUMMARY

According to the invention, there is provided a tuner arrangement comprising: at least one tuner having a plurality of frequency changers, each of which comprises a mixer and a local oscillator; and a controller for controlling the frequency of at least one of the local oscillators, the controller being arranged to perform the steps of:

(a) receiving a request for tuning the at least one tuner to a selected channel;

(b) determining a nominal frequency of the at least one local oscillator for tuning to the selected channel;

(c) calculating whether a beat frequency between a harmonic higher than the first harmonic of the at least one oscillator and a harmonic higher than the first harmonic of another of the local oscillators is within a frequency band within the tuner for the selected channel; and (d) if so, selecting a different frequency of the at least one local oscillator.

The arrangement may comprise a plurality of tuners, the step (a) may comprise receiving a request for tuning any selected one of the tuners to the selected channel, the step (c) may comprise calculating whether a beat frequency between a harmonic higher than the first harmonic of any of the local oscillators and a harmonic higher than the first harmonic of any other of the local oscillators is within a frequency band within any of the tuners for the selected channel of that tuner, and the step (d) may comprise selecting a different frequency of at least one local oscillator of the selected tuner.

The nominal frequency may convert the selected channel to a designed intermediate frequency of the tuner or the selected tuner.

The different frequency may be selected so as to move the beat frequency outside the frequency band. The different frequency may differ from the nominal frequency by a minimum amount sufficient to move the beat of frequency outside the frequency band.

The controller may be arranged to repeat the steps (c) and (d) at least once. If the second step (c) calculates a beat frequency within the frequency band, the second step (d) may select another different frequency which differs from the nominal frequency in a direction opposite that of the different frequency. If a third step (c) calculates a beat frequency within the frequency band, a third step (d) may select a further different frequency such that the beat frequency is at an acceptable frequency in the frequency band.

The controller may be arranged to control the frequency of at least one other of the local oscillators so as to maintain a substantially constant final intermediate frequency.

The step (c) may calculate the difference between each $N1_{th}$ harmonic, for $1<N1\leq NH1$, of the at least one local oscillator and each $N2_{th}$ harmonic, for $1<N2\leq NH2$, of the other local oscillator and may compare each difference with the frequency band. NH1 and NH2 may be equal to each other and may, for example, be equal to 15.

The controller may be arranged to respond to a temperature change by determining a change in a passband centre frequency of an intermediate frequency filter, changing the frequency of the at least one local oscillator to compensate at least partly for the change in centre frequency, and performing the steps (c) and (d).

It is thus possible to provide a technique for dealing with spurious heterodyne products or beats which avoids or at least partly overcomes the disadvantages of known techniques. Such a technique is performed automatically whenever channel reselection takes place without requiring manual alignment or the presence of means for measuring spurious products. In the case of multiple-tuner arrangements, breaks in or disruption to reception can be substantially avoided.

BRIEF DESCRIPTION OF DRAWINGS

FIG. 2 is a flow diagram illustrating operation of the arrangement of FIG. 1 to predict and avoid spurious heterodyne products or beats.

DETAILED DESCRIPTION

Figure 1:
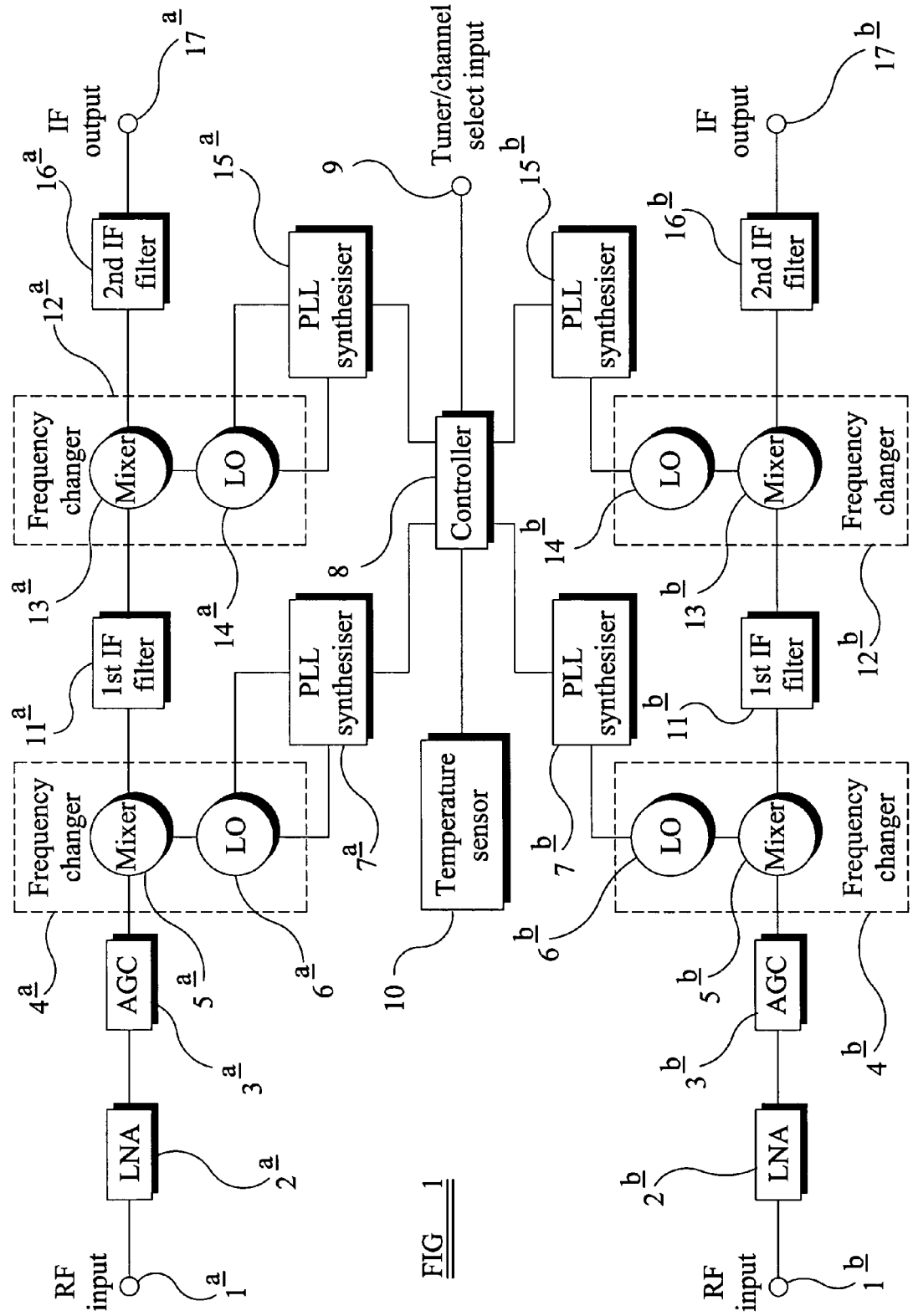
FIG. 1 is a block schematic diagram of a dual-tuner arrangement constituting an embodiment of the invention.

Although the tuner arrangement shown in FIG. 1 is of the dual-tuner type in which each tuner is of the double conversion type, this is given merely be way of example. The present techniques may be applied to a tuner arrangement comprising a single tuner with two or more frequency conversion stages. Also, the present techniques may be applied to arrangements comprising any number of tuners where the individual tuners have two or more conversion stages and may have the same number or a different number of conversion stages. Also, although the tuners shown in FIG. 1 provide standard output television intermediate frequencies, these techniques may be applied to tuners providing any output frequency including zero intermediate frequency (ZIF), near zero intermediate frequency (NZIF), low intermediate frequency and high intermediate frequency. Such tuners may be used for receiving signals distributed by a cable distribution system or by terrestrial or satellite broadcast systems.

The tuners forming the arrangement shown in FIG. 1 are of substantially identical construction and operation and comprise radio frequency (RF) inputs 1a, 1b, which may be connected together to a common input of the arrangement or may be separate. The inputs 1a and 1b are connected to the inputs of low noise amplifiers (LNAs) 2a and 2b, whose outputs are connected to the inputs of automatic gain control (AGC) arrangements 3a and 3b. Such arrangements are known in the context of double conversion receivers and will not be described further.

The outputs of the circuits 3a, 3b are supplied to frequency changers 4a, 4b of the up-conversion type for converting and selected input channel to a high first intermediate frequency, such as 1220 MHz. These first frequency changers comprise mixers 5a, 5b and local oscillators (LOs) 6a, 6b controlled by phase locked loop (PLL) synthesisers 7a, 7b. The synthesisers 7a, 7b are in turn controlled by a controller 8, which performs various control functions including determining local oscillator frequencies on the basis of tuner and channel select requests received at an input 9 and temperature information from a temperature sensor 10. The local oscillators 6a and 6b are controlled so as to provide high side mixing (local oscillator frequency greater than the selected channel frequency by the first intermediate frequency).

The outputs of the mixers 5a, 5b are supplied to first intermediate frequency (IF) filters 11a, 11b, which are of bandpass types having passbands centred on the first intermediate frequency and with a bandwidth which passes the selected channel at the first intermediate frequency and the frequency-converted channels adjacent thereto. Typically, the filters 11a, 11b pass the selected channel and one or two channels on each side thereof.

The outputs of the filters 11a, 11b are supplied to second frequency changers 12a, 12b of the down-conversion type for converting the selected channel from the first intermediate frequency to any desired second intermediate frequency, for example 45.75 MHz.

The frequency changers 12a, 12b comprise mixers 13a, 13b and local oscillators 14a, 14b controlled by phase locked loop synthesisers 15a, 15b. The synthesisers 15a, 15b are in turn controlled by the controller 8 and the frequency changers 12a, 12b perform low side mixing (the frequency of the local oscillators 14a, 14b is below the first intermediate frequency by the second intermediate frequency). The outputs of the mixers 13a, 13b are supplied to second intermediate frequency filters 16a, 16b which, for the conventional second intermediate frequency of the present example, are bandpass filters with a passband centred on the second intermediate frequency and a bandwidth substantially equal to one channel. The filters 16a, 16b thus supply the selected channels at the second intermediate frequency to IF outputs 17a, 17b.

FIG. 2 illustrates an algorithm performed within the controller 8 whenever a request is received at the input 9 for either of the tuners 1a-17a or 1b-17b to select a channel. The controller 8 receives the request and determines from this the frequency FD of the channel to be tuned by one of the tuners, say 1a-17a. It is assumed that the tuner 1b-17b is not in operation at this stage for simplicity of description.

The channel frequency FD input in a step 20 is then used in a step 21 to calculate the frequencies F1 and F2 of the local oscillators 6a and 14a for converting the selected channel to the first intermediate frequency of 1220 MHz and the second intermediate frequency of 45.75 MHz. For example, if the frequency of the selected channel is 751.25 MHz, the synthesiser 7a is controlled so as to set the output frequency of the local oscillator 6a to 751.25+1220=1971.25 MHz. The synthesiser 15a sets the local oscillator 14a to a frequency of 1220−45.75=1174.25 MHz.

A step 22 calculates all of the harmonic frequencies, above the first harmonic, of the local oscillators 6a and 14a up to maximum harmonic values of NH1 and NH2, respectively. The values for the present example are as follows:

| HARMONI | | |
|---|---|---|
| | LO1 | LO2 |
| fundamental | 1971.25 | 1174.25 |
| 2 | 3942.5 | 2348.5 |
| 3 | 5913.75 | 3522.75 |
| 4 | 7885 | 4697 |
| 5 | 9856.25 | 5871.25 |
| 6 | 11827.5 | 7045.5 |
| 7 | 13798.75 | 8219.75 |
| 8 | 15770 | 9394 |
| 9 | 17741.25 | 10568.25 |
| 10 | 19712.5 | 11742.5 |
| 11 | 21683.75 | 12916.75 |
| 12 | 23655 | 14091 |
| 13 | 25626.25 | 15265.25 |
| 14 | 27597.5 | 16439.5 |
| 15 | 29568.75 | 17613.75 |

A step 23 then calculates the absolute values of all the possible difference products between all combinations of harmonics of the local oscillators. The differences before forming the absolute values thereof in this example are as follows:

| MLO2−NLO1 = IF | | | | | | | |
|---|---|---|---|---|---|---|---|
| | N 1971.25 | | | | | | |
| M 1174.25 | 1 | 2 | 3 | 4 | 5 | 6 | 7 |
| 1 | −797 | −2768.25 | −4739.5 | −6710.75 | −8682 | −10653.25 | −12624.5 |
| 2 | 377.25 | −1594 | −3565.25 | −5536.5 | −7507.75 | −9479 | −11450.25 |
| 3 | 1551. | −419.75 | −2391 | −4362.25 | −6333.5 | −8304.75 | −10276 |
| 4 | 2725.75 | 754.5 | −1216.75 | −3188 | −5159.25 | −7130.5 | −9101.75 |
| 5 | 3900 | 1928.75 | −42.5 | −2013.75 | −3985 | −5956.25 | −7927.5 |
| 6 | 5074.25 | 3103 | 1131.75 | −839.5 | −2810.75 | −4782 | −6753.25 |
| 7 | 6248.5 | 4277.25 | 2306 | 334.75 | −1636.5 | −3607.75 | −5579 |
| 8 | 7422.75 | 5451.5 | 3480.25 | 1509 | −462.25 | −2433.5 | −4404.75 |
| 9 | 8597 | 6625.75 | 4654.5 | 2683.25 | 712 | −1259.25 | −3230.5 |
| 10 | 9771.25 | 7800 | 5828.75 | 3857.5 | 1886.25 | −85 | −2056.25 |
| 11 | 10945.5 | 8974.25 | 7003 | 5031.75 | 3060.5 | 1089.25 | −882 |
| 12 | 12119.75 | 10148.5 | 8177.25 | 6206 | 4234.75 | 2263.5 | 292.25 |
| 13 | 13294 | 11322.75 | 9351.5 | 7380.25 | 5409 | 3437.75 | 1466.5 |
| 14 | 14468.25 | 12497 | 10525.75 | 8554.5 | 6583.25 | 4612 | 2640.75 |
| 15 | 15642.5 | 13671.25 | 11700 | 9728.75 | 7757.5 | 5786.25 | 3815 |

| | N 1971.25 | | | | | | |
|---|---|---|---|---|---|---|---|
| M 1174.25 | 8 | 9 | 10 | 11 | 12 | 13 | 14 |
| 1 | −14595.75 | −16567 | −18538.25 | −20509.5 | −22480.75 | −24452 | −26423.25 |
| 2 | −13421.5 | −15392.75 | −17364 | −19335.25 | −21306.5 | −23277.75 | −25249 |
| 3 | −12247.25 | −14218.5 | −16189.75 | −18161 | −20132.25 | −22103.5 | −24074.75 |
| 4 | −11073 | −13044.25 | −15015.5 | −16986.75 | −18958 | −20929.25 | −22900.5 |
| 5 | −9898.75 | −11870 | −13841.25 | −15812.5 | −17783.75 | −19755 | −21726.25 |
| 6 | −8724.5 | −10695.75 | −12667 | −14638.25 | −16609.5 | −18580.75 | −20552 |
| 7 | −7550.25 | −9521.5 | −11492.75 | −13464 | −15435.25 | −17406.5 | −19377.75 |
| 8 | −6376 | −8347.25 | −10318.5 | −12289.75 | −14261 | −16232.25 | −18203.5 |
| 9 | −5201.75 | −7173 | −9144.25 | −11115.5 | −13086.75 | −15058 | −17029.25 |
| 10 | −4027.5 | −5998.75 | −7970 | −9941.25 | −11912.5 | −13883.75 | −15855 |
| 11 | −2853.25 | −4824.5 | −6795.75 | −8767 | −10738.25 | −12709.5 | −14680.75 |
| 12 | −1679 | −3650.25 | −5621.5 | −7592.75 | −9564 | −11535.25 | −13506.5 |
| 13 | −504.75 | −2476 | −4447.25 | −6418.5 | −8389.75 | −10361 | −12332.25 |
| 14 | 669.5 | −1301.75 | −3273 | −5244.25 | −7215.5 | −9186.75 | −11158 |
| 15 | 1843.75 | −127.5 | −2098.75 | −4070 | −6041.25 | −8012.5 | −9983.75 |

The absolute values of the difference products are compared with the utilised output bandwidth at the second intermediate frequency to determine whether a beat occurs within this bandwidth. The results of this comparison is as follows, where a "+" indicates that the relevant beat product is outside the utilised bandwidth:

| | | | | | | M-N | | | | | | | | |
|---|---|---|---|---|---|---|---|---|---|---|---|---|---|---|
| | | | | | | N 1971.25 | | | | | | | | |
| M 1174.25 | 1 | 2 | 3 | 4 | 5 | 6 | 7 | 8 | 9 | 10 | 11 | 12 | 13 | 14 |
| 1 | + | + | + | + | + | + | + | + | + | + | + | + | + | + |
| 2 | + | + | + | + | + | + | + | + | + | + | + | + | + | + |
| 3 | + | + | + | + | + | + | + | + | + | + | + | + | + | + |
| 4 | + | + | + | + | + | + | + | + | + | + | + | + | + | + |
| 5 | + | + | 42.5 | + | + | + | + | + | + | + | + | + | + | + |
| 6 | + | + | + | + | + | + | + | + | + | + | + | + | + | + |
| 7 | + | + | + | + | + | + | + | + | + | + | + | + | + | + |
| 8 | + | + | + | + | + | + | + | + | + | + | + | + | + | + |
| 9 | + | + | + | + | + | + | + | + | + | + | + | + | + | + |
| 10 | + | + | + | + | + | + | + | + | + | + | + | + | + | + |
| 11 | + | + | + | + | + | + | + | + | + | + | + | + | + | + |
| 12 | + | + | + | + | + | + | + | + | + | + | + | + | + | + |
| 13 | + | + | + | + | + | + | + | + | + | + | + | + | + | + |
| 14 | + | + | + | + | + | + | + | + | + | + | + | + | + | + |
| 15 | + | + | + | + | + | + | + | + | + | + | + | + | + | + |

If the comparison step 24 has revealed that no beat product was within the utilised output bandwidth at the second intermediate frequency, which in this example is from 42 to 47 MHz, then the frequency control data are loaded into the synthesisers 7a, 15a in a step 25 and the synthesisers control the local oscillators 6a, 14a so that their output frequencies are 1971.25 and 1174.25 MHz, respectively. However, because a beat product is within the utilised output bandwidth, a step 26 calculates a change in the first intermediate frequency IF1 to shift the beat outside the closest edge of the utilised bandwidth. Because the local oscillators and synthesisers 6a, 7a, 14a, 15a are such that the local oscillator frequencies are controlled in steps, the controller 8 determines the minimum number of tuning steps necessary to shift the first intermediate frequency so that the selected channel remains centred on the second intermediate frequency but the beat product is outside the bandwidth utilised by the channel at the second intermediate frequency.

In the present example, the step 26 determines that the frequency of the beat product must be reduced by 0.5 MHz in order to move it outside the utilised bandwidth. The frequency shifts required of the local oscillators 6a, 14a can be determined from the difference in order of the harmonics which give rise to the beat. In the present example, the third harmonic of the local oscillator 6a would beat with the fifth harmonic of the local oscillator 14a. If the first intermediate frequency is varied by one unit, then the Nth harmonic of the local oscillator 6a will vary by N units in the same direction with high side up-conversion mixing as in the present embodiment. Because the second frequency changer 12a uses low side down-conversion mixing, the frequency of the local oscillator 14a will move by the same amount in the same direction. If the frequency of the local oscillator 14a varies by one unit, then the frequency of its Nth harmonic will vary by N units in the same direction. The net shift in the beat product frequency will therefore be equal to the difference between the harmonic orders giving rise to the beat product multiplied by the change in the first intermediate frequency. Thus, in the present case, in order to reduce the frequency of the beat by 500 kHz the first intermediate frequency, and hence the frequencies of the oscillators 6a and 14a, must be increased by 250 kHz.

A step 27 determines whether the required shift in the first intermediate frequency is within the maximum permissible upward shift, for example so as to ensure that the selected channel remains within the passband of the first IF filter 11a. If so, then a step 28 calculates the local oscillator frequencies as described above and the steps 22 onwards are performed again in order to calculate whether the new local oscillator frequencies will give rise to beat products within the output utilised bandwidth. If not, the frequency control data are loaded in the synthesisers 7a and 15a. However, if the new local oscillator frequencies give rise to a beat in the utilised output bandwidth or if the shift determined in the step 27 is outside the allowed limit, then a step 29 calculates the minimum shift necessary in the first intermediate frequency to shift the beat outside the furthest edge of the utilised bandwidth. This would require a positive shift of 4.5 MHz in order to shift the beat frequency from 42.5 MHz to 47 MHz. This would result in a reduction in the frequencies of the local oscillators 6a and 14a of 2.25 MHz.

The steps 28 and 22 to 24 are shown as being performed again for this shift in the first intermediate frequency. However, in all tests performed to date, it has been found that it is not necessary to perform these steps so that, if the step 29 is performed, then the step 25 may be performed immediately after the step 28 without passing through the steps 22 to 24.

In the event that shifting the first intermediate frequency in both directions within allowed limits fails to prevent any beat products from occurring in the output utilised bandwidth at the second intermediate frequency, a further algorithm may be performed to adjust the local oscillator frequencies so that the beat occurs at a best position for minimising the effects of interference. This is generally possible because not all frequencies within the utilised band will have the same impact on reception performance.

If a channel select request is then received by the controller 8 for tuning the tuner 1b-17b to select a channel for reception, the algorithm illustrated in FIG. 2 is performed in respect of the tuner 1b-17b so as to ensure that there are no beat products between harmonics of the local oscillators 6b and 14b within the output utilised band. This algorithm is then repeated for heterodyne products between the local oscillators 6a and 6b, between the local oscillators 6b and 14a, and between the local oscillators 14b and 6a so as to ensure that either there are no heterodyne products or beats in the output utilised band or any such beats are moved outside this band. If both tuners have the same utilised output band, then a single comparison with each possible beat is sufficient. If the tuners have different output utilised bands, then the algorithm must check for the presence of beats in either band.

In order not to interrupt reception by a tuner whose tuning is not being changed, remedial action is taken in respect of the tuner which is responding to a channel request or select input. Each time a fresh channel select request is received, the controller 8 performs the above described technique for checking for beats between the tuners on the basis of the actual local oscillator frequencies in the tuner whose tuning is not being changed. Thus, undesirable beats can always be detected and no interruption in reception is necessary to achieve this.

The present technique thus allows possible beat interference to be predicted and avoided before it can occur. The local oscillator frequencies of the tuner receiving the channel select request are not changed from existing values, which were previously set so as to avoid beat interference, until new values which avoid beat interference have been determined.

This technique may be extended to include avoidance of other interference mechanisms. For example, it may be used to prevent the second local oscillator mixing with an input channel at the input of the first frequency converter to produce a mixing product which lies on a second desired channel at the input of the first frequency converter.

This technique may be applied to tuners comprising more than two frequency converters. In arrangements where the final intermediate frequency is required to be constant, any combination of the earlier intermediate frequencies may be varied so as to avoid beat products within the output utilised band resulting from beating between harmonics of each combination of two oscillators. Where the final intermediate frequency may also be varied, then all intermediate frequencies may be varied in any suitable combination.

This technique may also be extended to include compensation for changes in IF filter performance with temperature. The characteristics of, for example, the first IF filters 11a and 11b will drift with temperature so that the selected channel converted to the first intermediate frequency will not be properly centred on the passband of these filters. The temperature sensor 10 supplies information about the temperatures of the filters to the controller 8, which converts this to information about the prevailing filter centre frequencies. The controller 8 determines the shift in the nominal intermediate frequency and calculates shifts in the local oscillator frequencies to compensate for this. The calculated local oscillator frequencies are then checked for undesirable beats as described hereinbefore and the controller determines an optimum set of frequencies for tracking temperature drift of any of the IF filters while avoiding interference from heterodyne beats.

The present technique may be used in tuners without requiring additional hardware for its implementation. In particular, this technique may be embodied by means of additional software for existing program-controlled controllers used in tuners and tuner arrangements. The technique may therefore be employed with no component costs and minimal overall difference in cost.

What is claimed:

1. A tuner arrangement comprising:
   at least one tuner having a plurality of frequency changers, each of which comprises a mixer and a local oscillator; and
   a controller for controlling a frequency of at least one of said local oscillators, said controller being arranged to perform the steps of:
   (a) receiving a request for tuning said at least one tuner to a selected channel;
   (b) determining a nominal frequency of said at least one local oscillator for tuning to said selected channel;
   (c) performing, in response to the received request for tuning, a calculation to determine whether a beat frequency between a harmonic higher than a first harmonic of said at least one oscillator and a harmonic higher than a first harmonic of another of said local oscillators is within a frequency band within said tuner for said selected channel; and
   (d) if so, selecting a different frequency of said at least one local oscillator, wherein step (c) when performed a second time calculates said beat frequency within said frequency band, and said step (d) when performed a second time selects another different frequency which differs from said nominal frequency in a direction opposite that of said different frequency.

2. An arrangement as claimed in claim 1, in which: said at least one tuner comprises a plurality of tuners; said step (a) comprises receiving said request for tuning any selected one of said tuners to said selected channel; said step (c) comprises calculating whether a beat frequency between said harmonic higher than said first harmonic of any of said local oscillators and a harmonic higher than said first harmonic of any other of said local oscillators is within said frequency band within any of said tuners for said selected channel; and said step (d) comprises selecting said different frequency of said at least one local oscillator of said selected tuner.

3. An arrangement as claimed in claims 1, in which said nominal frequency converts said selected channel to a designed intermediate frequency of said tuner.

4. An arrangement as claimed in claim 1, in which said different frequency is selected so as to move said beat frequency outside the frequency band.

5. An arrangement as claimed in claim 4, in which said different frequency differs from said nominal frequency by a minimum amount sufficient to move said beat frequency outside said frequency band.

6. An arrangement as claimed in claim 1, in which, said step (c) are performed a third time and, if said step (c) when performed a third time calculates a beat frequency within said frequency band, said step (d) when performed a third time selects a further different frequency such that said beat frequency is at an acceptable frequency in said frequency band.

7. An arrangement as claimed in claim 1, in which said controller is arranged to control said frequency of at least one other of said local oscillators so as to maintain a substantially constant final intermediate frequency.

8. A tuner arrangement comprising:
   at least one tuner having a plurality of frequency changers, each of which comprises a mixer and a local oscillator; and
   a controller for controlling a frequency of at least one of said local oscillators, said controller being arranged to perform the steps of:
   (a) receiving a request for tuning said at least one tuner to a selected channel;

(b) determining a nominal frequency of said at least one local oscillator for tuning to said selected channel;

(c) performing, in response to the received request for tuning, a calculation to determine whether a beat frequency between a harmonic higher than a first harmonic of said at least one oscillator and a harmonic higher than a first harmonic of another of said local oscillators is within a frequency band within said tuner for said selected channel; and (d) if so, selecting a different frequency of said at least one local oscillator, wherein step (c) a calculates a difference between each $N1_{th}$ harmonic, for $1 < N1 \leqq$ a first value NH1, of said at least one local oscillator and each $N2_{th}$ harmonic, for $1 < N2 \leqq$ a second value NH2, of said other local oscillator and compares each said difference with said frequency band.

9. An arrangement as claimed in claim 8, in which NH1=NH2=15.

10. An arrangement as claimed in claim 8, in which said at least tuner comprises an intermediate frequency filter and said controller is arranged to respond to a temperature change by determining a change in a passband centre frequency of said intermediate frequency filter, changing said frequency of said at least one local oscillator to compensate at least partly for said change in centre said frequency, and performing said steps (c) and (d).

* * * * *